(12) United States Patent
Hirasawa et al.

(10) Patent No.: US 11,943,948 B2
(45) Date of Patent: Mar. 26, 2024

(54) LIGHT EMITTING DEVICE

(71) Applicant: PIONEER CORPORATION, Tokyo (JP)

(72) Inventors: Akira Hirasawa, Tokyo (JP); Yuhki Terao, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 407 days.

(21) Appl. No.: 17/418,709

(22) PCT Filed: Dec. 26, 2019

(86) PCT No.: PCT/JP2019/051164
§ 371 (c)(1),
(2) Date: Jun. 25, 2021

(87) PCT Pub. No.: WO2020/138306
PCT Pub. Date: Jul. 2, 2020

(65) Prior Publication Data
US 2022/0085316 A1    Mar. 17, 2022

(30) Foreign Application Priority Data
Dec. 28, 2018 (JP) ................... 2018-247736

(51) Int. Cl.
*H10K 50/17* (2023.01)
*H10K 50/15* (2023.01)
(Continued)

(52) U.S. Cl.
CPC .......... *H10K 50/17* (2023.02); *H10K 50/156* (2023.02); *H10K 71/00* (2023.02); *H10K 2102/00* (2023.02); *H10K 2102/351* (2023.02)

(58) Field of Classification Search
CPC ...... H10K 50/17; H10K 50/156; H10K 71/00; H10K 2102/00; H10K 2102/351
(Continued)

(56) References Cited

U.S. PATENT DOCUMENTS 7,572,522 B2   8/2009   Seo et al.
7,579,089 B2   8/2009   Seo et al.
(Continued)

FOREIGN PATENT DOCUMENTS

JP   2002-313583 A   10/2002
JP   2006324537 A   11/2006
(Continued)

OTHER PUBLICATIONS

International Search Report dated Mar. 10, 2020 from International Patent Application No. PCT/JP2019/051164, 1 page.
(Continued)

*Primary Examiner* — Mohammad A Rahman
(74) *Attorney, Agent, or Firm* — Procopio, Cory, Hargreaves & Savitch LLP

(57) ABSTRACT

The first region (RG1) contains a first organic material and a metal compound (a compound containing a metal element). The second region (RG2) contains the first organic material and the metal compound. The average intensity of the SIMS profile of the metal element in the second region (RG2) can be lower than the average intensity of the SIMS profile of the metal element in the first region (RG1). Specifically, the average intensity of the SIMS profile of the metal element in the second region (RG2) can be lower than 10%, preferably lower than 1.0%, of the average intensity of the SIMS profile of the metal element in the first region (RG1).

8 Claims, 2 Drawing Sheets

(51) Int. Cl.
*H10K 71/00* (2023.01)
*H10K 102/00* (2023.01)

(58) Field of Classification Search
CPC .... H10K 2101/80; H10K 50/15; H10K 10/10;
H10K 19/00; H10K 30/00; H10K 39/00;
H10K 50/00; H10K 59/00; H10K 65/00;
H10K 77/00; H10K 85/00; H10K 99/10;
H10K 2101/00
See application file for complete search history.

(56) References Cited

U.S. PATENT DOCUMENTS

| | | |
|---|---|---|
| 7,745,989 B2 | 6/2010 | Yamakazi et al. |
| 7,935,433 B2 | 5/2011 | Itai et al. |
| 7,948,169 B2 | 5/2011 | Yamakazi et al. |
| 8,310,147 B2 | 11/2012 | Seo et al. |
| 8,378,570 B2 | 2/2013 | Yamakazi et al. |
| 8,519,617 B2 | 8/2013 | Yamaqzaki et al. |
| 8,674,353 B2 | 3/2014 | Okamoto et al. |
| 2002/0086180 A1 | 7/2002 | Seo et al. |
| 2005/0260440 A1 | 11/2005 | Seo et al. |
| 2007/0013301 A1 | 1/2007 | Yamazaki et al. |
| 2008/0038583 A1 | 2/2008 | Itai et al. |
| 2009/0273280 A1 | 11/2009 | Seo et al. |
| 2010/0258792 A1 | 10/2010 | Yamakazi et al. |
| 2011/0198585 A1 | 8/2011 | Yamakazi et al. |
| 2012/0187390 A1 | 1/2012 | Yan et al. |
| 2013/0134408 A1 | 5/2013 | Yamakazi et al. |
| 2016/0118617 A1* | 4/2016 | Saito ............... H10K 50/11 257/40 |

FOREIGN PATENT DOCUMENTS

| | | |
|---|---|---|
| JP | 2007043122 A | 2/2007 |
| WO | 2005/064994 A1 | 7/2005 |
| WO | 2011040238 A1 | 4/2011 |

OTHER PUBLICATIONS

Japanese Office Action received in JP Application No. 2020-562419, dated Nov. 1, 2022, in 4 pages.
Cao, X A, et al.: "Conductivity Enhancement in Organic Electronics by Delta Doping", IEEE Electron Device Letters, IEEE, USA, vol. 37., No. 12, Dec. 1, 2016 (Dec. 1, 2016), pp. 1628-1631, XP011635091, ISSN: 0741-3106, DOI: 10.1109/LED.2016.2620184 [retrieved on Nov. 22, 2016] p. 1628-p. 1629, figure 1.
Li, Xiaomeng: "Performance Enhancement of Organic Light-Emitting Diodes with an Inorganically Doped Hole Transport Layer", Jan. 1, 2016 (Jan. 1, 2016), XP055943585, Retrieved from the Internet: URL:https://researchrepository.wvu.edu/cgi/viewcontent.cgi?article=7118&context=etd [retrieved on Jul. 18, 2022] p. 73-p. 83, figures 5.2, 5.6.
European Search Report received in co-pending European Application No. 19905814.0, dated Jul. 27, 2022, in 10 pages.

* cited by examiner

LIGHT EMITTING DEVICE

CROSS-REFERENCE TO RELATED APPLICATIONS

This application is a U.S. National Stage entry of PCT Application No: PCT/JP2019/051164 filed Dec. 26, 2019, which claims priority to Japanese Patent Application No. 2018-247736 filed Dec. 28, 2018, the contents of which are incorporated herein by reference.

TECHNICAL FIELD

The present invention relates to a light emitting device.

BACKGROUND ART

In recent years, there have been cases where a light emitting device has an organic light emitting diode (OLED). The OLED includes a first electrode, an organic layer, and a second electrode. The organic layer includes a light emitting layer (EML) that emits light by organic electroluminescence (EL). The organic layer may further include a functional layer (for example, a hole injection layer (HIL) or a hole transport layer (HTL)) between the first electrode and the EML.

Patent Document 1 describes an example of a method of forming a functional layer containing an organic material and a metal compound. The functional layer is formed by the co-evaporation of the organic material and the metal compound. Patent Document 1 describes that the concentration of the metal compound in the functional layer is decreased from the first electrode side toward the EML side by controlling a condition of the co-evaporation (for example, the distance from an evaporation source to an evaporation target).

Patent Document 2 describes an example of a method of forming a functional layer containing a first metal compound and a second metal compound. The functional layer is formed by the co-evaporation of the first metal compound and the second metal compound. Patent Document 2 describes that the mix proportion of the first metal compound and the mix proportion of the second metal compound in the functional layer are changed from the first electrode side toward the EML side by controlling the evaporation speed of the second metal compound.

RELATED DOCUMENT

Patent Document

[Patent Document 1] Japanese Unexamined Patent Publication No. 2007-43122
[Patent Document 2] Pamphlet of International Publication No. WO 2011/040238

SUMMARY OF THE INVENTION

Technical Problem

The present inventors studied realization of a preferred concentration distribution of a metal element-containing compound (for example, a molybdenum oxide) in an organic material, such as that the concentration is lower at a position away from the first electrode by a certain distance than at a position near the first electrode.

One example of the problems to be solved by the present invention is to realize a preferred concentration distribution of a compound containing a metal element in the organic material.

Solution to Problem

An exemplary aspect of the present invention is a light emitting device including:
a first electrode;
an organic layer positioned over the first electrode and including a first layer; and
a second electrode positioned over the organic layer,
wherein the first layer includes
a first region including a first organic material and a compound including a metal element, the first region being in contact with the first electrode, and
a second region including the first organic material and the compound, the second region being positioned farther away from the first electrode than the first region, and
an average intensity of a SIMS profile of the metal element in the second region is lower than 10% of an average intensity of a SIMS profile of the metal element in the first region.

An exemplary aspect of the present invention is a light emitting device including:
a first electrode;
an organic layer positioned over the first electrode and including a first layer; and
a second electrode positioned over the organic layer,
wherein the first layer includes
a first region including a first organic material and a compound including a metal element, the first region being in contact with the first electrode, and
a second region including the first organic material and the compound, the second region being positioned farther away from the first electrode than the first region, and
a maximum intensity of a SIMS profile of the metal element in the second region is lower than 10% of a maximum intensity of a SIMS profile of the metal element in the first region.

An exemplary aspect of the present invention is a light emitting device including:
a first electrode;
an organic layer positioned over the first electrode and including a first layer; and
a second electrode positioned over the organic layer,
wherein the first layer includes
a first region including a first organic material and a compound including a metal element, the first region being in contact with the first electrode, and
a second region including the first organic material and the compound, the second region being positioned farther away from the first electrode than the first region, and
an average of profiles of a proportion of a volume of the compound in a total of a volume of the first organic material and the volume of the compound in the second region is less than 10% of an average of profiles of a proportion of a volume of the compound in a total of a volume of the first organic material and the volume of the compound in the first region.

An exemplary aspect of the present invention is a light emitting device including:
a first electrode;
an organic layer positioned over the first electrode and including a first layer; and a second electrode positioned over the organic layer,
wherein the first layer includes
a first region including a first organic material and a compound including a metal element, the first region being in contact with the first electrode, and
a second region including the first organic material and the compound, the second region being positioned farther away from the first electrode than the first region, and
a maximum of profiles of a proportion of a volume of the compound in a total of a volume of the first organic material and the volume of the compound in the second region is less than 10% of a maximum of profiles of a proportion of a volume of the compound in a total of a volume of the first organic material and the volume of the compound in the first region.

DESCRIPTION OF EMBODIMENTS

Figure 1:
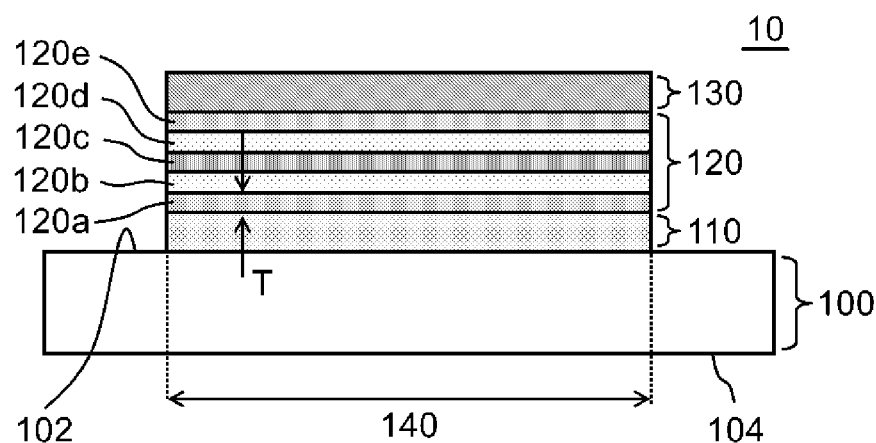
FIG. 1 is a cross-sectional view of a light emitting device according to an embodiment.

Hereinafter, an embodiment of the present invention will be described using the drawings. In all of the drawings, the same configuration elements will be given the same reference sign and will not be repeated.

An expression "A is positioned over B" in the present specification may mean that A is directly positioned on B with no different element (for example, a layer) positioned between A and B or may mean that a different element (for example, a layer) is partially or fully positioned between A and B. Furthermore, expressions indicating orientations, such as "up", "down", "left", "right", "front", and "back" are basically used in accordance with orientations in the drawings and are not interpreted to be limited to, for example, orientations in which an invented product described in the present specification is used.

An anode in the present specification refers to an electrode from which a hole is injected into a layer containing a light emitting material (for example, an organic layer) and a cathode refers to an electrode from which an electron is injected into the layer containing the light emitting material. In addition, expressions "anode" and "cathode" may also mean different terms such as "hole injection electrode" and "electron injection electrode" or "positive electrode" and "negative electrode".

"Light emitting device" in the present specification includes devices having a light emitting element such as a display, lighting, or the like. In addition, "light emitting device" may include wires, integrated circuits (ICs), casing, or the like that are directly, indirectly, or electrically connected to the light emitting element.

In the present specification, unless otherwise noted, expressions such as "first, second, A, B, (a), and (b)" and the like are expressions for differentiating elements, and the essence, sequence, order, number, or the like of the corresponding element is not limited by the expression.

In the present specification, each member and each element may be singular or plural, unless the context clarifies whether a member or element is "singular" or "plural".

In the present specification, unless otherwise noted, the expression "A includes B" does not necessarily mean that A consists of B and possibly means that A may consist of element other than B.

Unless otherwise noted, "cross section" in the present specification means a surface that appears at the time of cutting the light emitting device in a direction in which pixels, light emitting materials, or the like are laminated.

In the present specification, expressions that describe anteroposterior relations in time such as "after", "subsequent to", "next", and "before" indicate relative time relations, and individual elements for which an anteroposterior relation in time is used are not necessarily continuous from each other. In the case of expressing individual elements that are continuous from each other, an expression "immediately", "directly", or the like may be used.

An expression "A is heated" in the present specification means that heat is applied to A and does not necessarily mean that only A is heated. The corresponding expression may mean that, for example, an element including A is heated. In addition, "A is heated" means that heat is applied to A intentionally or artificially, but does not include a simple change in the temperature of the atmosphere around A.

Figure 2:
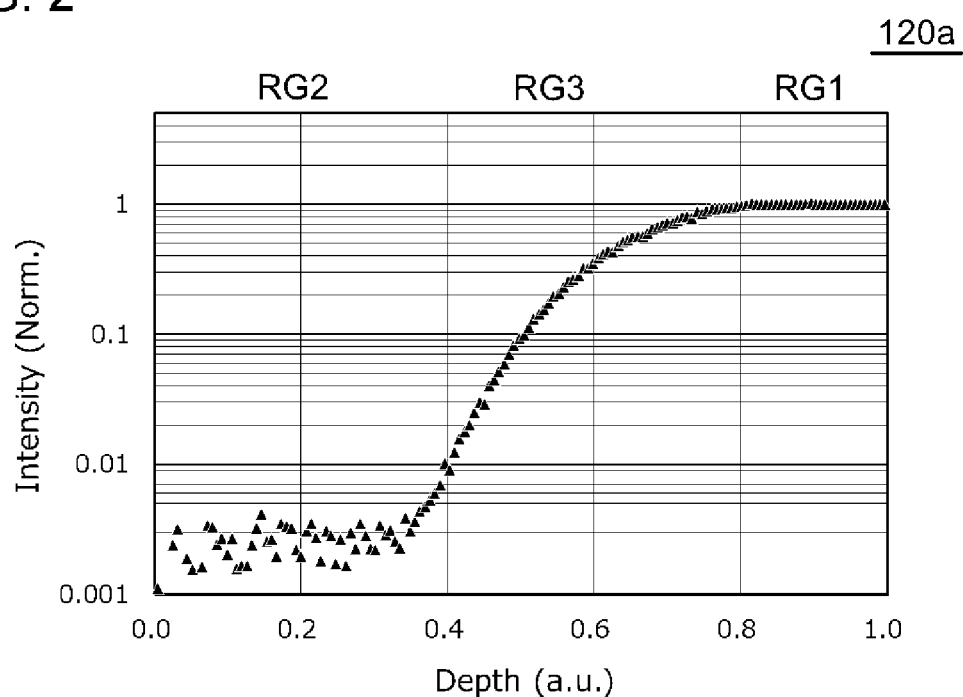
FIG. 2 is a view showing an example of a secondary ion mass spectrometry (SIMS) profile in a first layer shown in FIG. 1.

FIG. 1 is a cross-sectional view of a light emitting device 10 according to an embodiment. FIG. 2 is a view showing an example of a secondary ion mass spectrometry (SIMS) profile in a first layer 120a shown in FIG. 1.

The outline of the light emitting device 10 will be described using FIG. 1 and FIG. 2. The light emitting device 10 includes a first electrode 110, an organic layer 120, and a second electrode 130. The organic layer 120 is positioned over the first electrode 110. The organic layer 120 includes a first layer 120a. The second electrode 130 is positioned over the organic layer 120. The first layer 120a includes a first region RG1 and a second region RG2. The first region RG1 contains a first organic material and a metal compound (a compound containing a metal element). The first region RG1 is in contact with the first electrode 110. The second region RG2 contains the first organic material and the metal compound. The second region RG2 is positioned farther away from the first electrode 110 than the first region RG1.

The SIMS profile shown in FIG. 2 shows signals derived from the metal element in the metal compound. Specifically, the SIMS profile shown in FIG. 2 shows the signals of a molybdenum element in a molybdenum oxide. The SIMS profile shown in FIG. 2 has a correlation with a profile of the proportion of the metal compound in the total of the volume of the first organic material and the volume of the metal compound.

In the present embodiment, the average intensity of the SIMS profile of the metal element in the second region RG2 can be lower than the average intensity of the SIMS profile of the metal element in the first region RG1. Specifically, as shown in FIG. 2, the average intensity of the SIMS profile of the metal element in the second region RG2 can be lower than 10%, preferably lower than 1.0%, of the average intensity of the SIMS profile of the metal element in the first region RG1.

In the present embodiment, the maximum intensity of the SIMS profile of the metal element in the second region RG2 can be lower than the maximum intensity of the SIMS profile of the metal element in the first region RG1. Specifically, as shown in FIG. 2, the maximum intensity of the SIMS profile of the metal element in the second region RG2 can be lower than 10%, preferably lower than 1.0%, of the maximum intensity of the SIMS profile of the metal element in the first region RG1.

The first layer 120a can be formed by heating the first organic material and the metal compound at a temperature equal to or higher than the glass transition temperature Tg1 of the first organic material. The present inventors studied a process for forming the first layer 120a and, as a result, newly found that, in the case of heating the first layer 120a at a temperature equal to or higher than the glass transition temperature Tg1 of the first organic material, the concentration of the metal compound can be lower at a position away from the first electrode 110 by a certain distance than at a position near the first electrode 110. That is, the concentration distribution of the metal compound in the first layer 120a can be controlled by a simple process of heating the first layer 120a.

The above-described concentration distribution of the metal compound is preferred for the light emitting device 10. The concentration of the metal compound at the position near the first electrode 110 is desirably high due to a variety of requests (for example, an improvement in the current injection efficiency or an improvement in the adhesion to the first electrode 110). However, an excess increase in the amount of the metal compound may cause a variety of adverse effects (for example, the degradation of the rectifying property). Therefore, the concentration of the metal compound at the position away from the first electrode 110 by a certain distance is desirably not too high. In the above-described concentration distribution, the concentration of the metal compound at the position away from the first electrode 110 by a certain distance can be lower than the concentration of the metal compound at the position near the first electrode 110.

The detail of the light emitting device 10 will be described using FIG. 1.

The light emitting device 10 includes a substrate 100, the first electrode 110, the organic layer 120, and the second electrode 130.

The substrate 100 has a first surface 102 and a second surface 104. The first electrode 110, the organic layer 120, and the second electrode 130 are positioned on the first surface 102 side of the substrate 100. The second surface 104 is present opposite to the first surface 102.

The substrate 100 is capable of functioning as a support for forming the first electrode 110, the organic layer 120, and the second electrode 130. The substrate 100 may be translucent and flexible. The substrate 100 may be a single layer or as a plurality of layers. In one example, the substrate 100 may be a glass substrate. In another example, the substrate 100 may be a resin substrate and may contain an organic material (for example, polyethylene naphthalate (PEN), polyethersulfone (PES), polyethylene terephthalate (PET), or polyimide). Ina case where the substrate 100 is the resin substrate, at least one of the first surface 102 and the second surface 104 of the substrate 100 may have an inorganic barrier layer (for example, SiN or SiON). A layer containing one or more layers of an organic material may be provided between the substrate 100 and the first electrode 110 in a region that is wider than at least the first electrode 110 for the purpose of flattening or improvement in adhesion.

The first electrode 110 is capable of function as an anode. In one example, the first electrode 110 may include a metal or an alloy. The metal or the alloy is, for example, silver or a silver alloy. In this example, the thickness of the first electrode 110 may be, for example, equal to or larger than 5 nm and equal to or smaller than 50 nm. In a case where the thickness of the first electrode 110 is equal to or larger than the above-described lower limit, it is possible to decrease the electrical resistance of the first electrode 110, and, in a case where the thickness of the first electrode 110 is equal to or smaller than the above-described upper limit, it is possible to increase the transmission of the first electrode 110. In another example, the first electrode 110 may include an oxide semiconductor. Examples of the oxide semiconductor include indium tin oxide (ITO), indium zinc oxide (IZO), indium tungsten zinc oxide (IWZO), zinc oxide (ZnO), and indium gallium zinc oxide (IGZO).

The organic layer 120 includes the first layer 120a, a hole transport layer (HTL) 120b, a light emitting layer (EML) 120c, an electron transport layer (ETL) 120d, and an electron injection layer (EIL) 120e. Each of the first layer 120a, the HTL 120b, the EML 120c, the ETL 120d, and the EIL 120e may be a single layer or a plurality of layers. In the organic layer 120, holes are injected from the first electrode 110 into the EML 120c through the first layer 120a and the HTL 120b, and electrons are injected from the second electrode 130 into the EML 120c through the EIL 120e and the ETL 120d. The organic layer 120 may not include the HTL 120b, the ETL 120d, and the EIL 120e.

The first layer 120a is capable of functioning as a functional layer having a specific characteristic. The first layer 120a may have, for example, at least one of a hole injection characteristic and a hole transport characteristic and is capable of functioning as, for example, at least one of a hole injection layer (HIL) and a hole transport layer (HTL). The first layer 120a is positioned over the first electrode 110 and is in contact with the first electrode 110.

The first layer 120a contains a first organic material and a metal compound.

The first organic material may be, for example, an electron-accepting organic semiconductor material having a glass transition temperature. Examples of the first organic material include triphenylamine derivatives, specifically, 4,4'-bis[N-(1-naphthyl)-N-phenyl-amino]-biphenyl (α-NPD). In addition, it is also possible to appropriately use a well-known organic material that has been used for the production of organic EL elements in the related art such as an aromatic amine compound such as 4,4',4"-tris(carbazole-9-yl)-triphenylamine (TCTA); a carbazole derivative such as 1,3-bis(N-carbazolyl)benzene; or a spiro compound such as N,N'-bis(naphthalen-1-yl)-N,N'-bis(phenyl)-9,9'-spirobisfluorene (Spiro-NPB).

The metal compound may be a metal compound having an acceptor property, such as a metal oxide. The metal oxide may be, for example, a transition metal oxide. The transition metal oxide may be, for example, a molybdenum oxide, a titanium oxide, a zirconium oxide, a hafnium oxide, a vanadium oxide, a niobium oxide, a tantalum oxide, a chromium oxide, a tungsten oxide, a manganese oxide, or a rhenium oxide.

The metal compound may be a molybdenum oxide. The molybdenum oxide has a composition represented by $MoO_x$, ($2 \leq x \leq 3$) and is at least one of molybdenum trioxide ($MoO_3$) and molybdenum dioxide ($MoO_2$) and preferably molybdenum trioxide ($MoO_3$).

In the first layer 120a, the concentration of the metal compound is lower at a position away from the first electrode 110 (the interface between the first electrode 110 and the first layer 120a) by a certain distance than at a position near the first electrode 110 (an interface between the first electrode 110 and the first layer 120a).

The first layer 120a may contain, for example, equal to or more than 1% by volume and equal to or less than 20% by volume of the metal compound with respect to the total volume of the first layer 120a. In a case where the volume percentage of the metal compound is equal to or higher than the above-described lower limit, it is possible to improve the characteristics (for example, the conductive property) of the light emitting device 10. In a case where the volume percentage of the metal compound is equal to or lower than the above-described upper limit, the concentration of the metal compound can be sufficiently lower at the position away from the first electrode 110 by a certain distance than at the position near the first electrode 110, by heating the first layer 120a.

The concentration of the metal compound in the first layer 120a can be regarded as the signal intensity of the metal element that configures the metal compound (for example, the molybdenum (Mo) element that configures the molybdenum oxide) in a secondary ion mass spectrometry (SIMS) depth profile (vertical direction in FIG. 1).

After the heating of the first layer 120a, the first layer 120a may have a thickness T of, for example, equal to or larger than 5 nm and equal to or smaller than 200 nm.

The second electrode 130 is capable of functioning as a cathode. In one example, the second electrode 130 may contain a metal or alloy. The metal or alloy is, for example, at least one metal selected from a group consisting of Al, Au, Ag, Pt, Mg, Sn, Zn, and In or an alloy of metals selected from the above-described group.

The first electrode 110, the organic layer 120, and the second electrode 130 are arranged in order from the first surface 102 of the substrate 100 to form a light emitting portion 140.

The light emitting device 10 may be bottom emission or top emission. In a case where the light emitting device 10 is bottom emission, light emitted from the organic layer 120 transmits through the first electrode 110 and the substrate 100 (that is, in a case where the light emitting device 10 is bottom emission, the substrate 100 and the first electrode 110 are translucent), and the light is emitted from the second surface 104 of the substrate 100. In a case where the light emitting device 10 is top emission, light emitted from the organic layer 120 transmits through the second electrode 130 (that is, in a case where the light emitting device 10 is top emission, the second electrode 130 is translucent), and the light is emitted from a side opposite to the second surface 104 of the substrate 100.

The detail of the first layer 120a will be described using FIG. 2.

The first layer 120a includes the first region RG1, the second region RG2, and a third region RG3. The first region RG1, the second region RG2, and the third region RG3 contain a first organic material and a metal compound (a compound containing a metal element). The first region RG1, the third region RG3, and the second region RG2 are arranged in order from the first electrode 110 side (the deep side in the horizontal axis of FIG. 2).

The first region RG1 is in contact with the first electrode 110. The range of the first region RG1 can be determined by a variety of guidelines. In one example, the range of the first region RG1 may be determined based on the distance from the boundary between the first electrode 110 and the first layer 120a. For example, the first region RG1 may be positioned up to 10 nm from the boundary between the first electrode 110 and the first layer 120a. In another example, the range of the first region RG1 may be determined such that the maximum intensity of the SIMS profile of the metal element in the third region RG3 (the detail will be described below) is 90% of the average concentration of the SIMS profile of the metal element in the first region RG1.

The first region RG1 has a certain thickness. For example, the first region RG1 has a thickness of equal to or larger than 5 nm and preferably has a thickness of equal to or larger than 10 nm. In this case, it is possible to increase the conductivity of the first layer 120a and to improve the adhesion between the first electrode 110 and the first layer 120a. The thickness of the first region RG1 may be thicker than the thickness of the second region RG2 (the detail will be described below). In this case, it is possible to increase the conductivity of the first layer 120a.

The second region RG2 is positioned farther away from the first electrode 110 than the first region RG1. The second region RG2 may be in contact with a layer over the first layer 120a (the HTL 120b in the example shown in FIG. 1). The range of the second region RG2 can be determined by a variety of guidelines. In one example, the range of the second region RG2 may be determined such that the average intensity of the SIMS profile of the metal element in the second region RG2 is equal to or lower than a certain proportion of the average intensity of the SIMS profile of the metal element in the first region RG1.

The second region RG2 has a certain thickness. For example, the second region RG2 has a thickness of equal to or larger than 5 nm and preferably has a thickness of equal to or larger than 10 nm. In this case, it is possible to improve the reliability of the light emitting device 10 (for example, to suppress the current value at the time of applying a reverse bias current).

The intensity of the SIMS profile of the metal element in the second region RG2 can be equal to or lower than 10%, preferably equal to or lower than 1.0%, of the intensity of the SIMS profile of the metal element in the first region RG1. In this case, it is possible to improve the reliability of the light emitting device 10.

The intensity of the SIMS profile of the metal element in the second region RG2 can be equal to or higher than 0.1%, preferably equal to or higher than 0.2%, of the intensity of the SIMS profile of the metal element in the first region RG1. In this case, it is possible to reduce the electrical resistance in the second region RG2.

The third region RG3 is positioned between the first region RG1 and the second region RG2. The third region RG3 may be in contact with the first region RG1 and the second region RG2. The intensity of the SIMS profile of the metal element in the third region RG3 decreases from the first region RG1 to the second region RG2. The intensity of the SIMS profile of the metal element in the third region RG3 may not strictly decrease monotonously, but may partially increase. For example, even in a case where the intensity of the SIMS profile of the metal element in the third region RG3 partially increases, when the fitting curve of plots throughout the entire SIMS profile of the metal element in the third region RG3 monotonically decreases, the intensity of the SIMS profile of the metal element in the third region RG3 may be regarded as being decreased.

The third region RG3 has a certain thickness. For example, the third region RG3 has a thickness of equal to or larger than 5 nm and preferably has a thickness of equal to or larger than 10 nm. In a case where the thickness in the third region RG3 is thick, it is possible to make the concentration gradient in the third region RG3 shallow. For example, the slope of the SIMS profile in the third region RG3 is equal to or more than 0.5%/nm and equal to or less than 20%/nm when the average intensity of the SIMS profile in the first region RG1 is 100%. When the concentration gradient is shallow (the concentration distribution does not change stepwise), it is possible to reduce the injection barrier of charges and to reduce a voltage increase caused by the injection barrier. Furthermore, when the concentration gradient is shallow (the concentration distribution does not change stepwise), it is possible to reduce the refractive index step and to reduce a decrease in the light extraction efficiency caused by the refractive index step.

The coefficient of variation of the intensity of the SIMS profile of the metal element in the first region RG1 may be larger than the coefficient of variation of the intensity of the SIMS profile of the metal element in the second region RG2. The coefficient of variation is the ratio of the standard deviation to the mean value. In a manufacturing process according to the present embodiment, the variation (coefficient of variation) in the intensity of the SIMS profile of the metal element in the first region RG1 may be larger than the variation (coefficient of variation) in the intensity of the SIMS profile of the metal element in the second region RG2.

Figure 3:
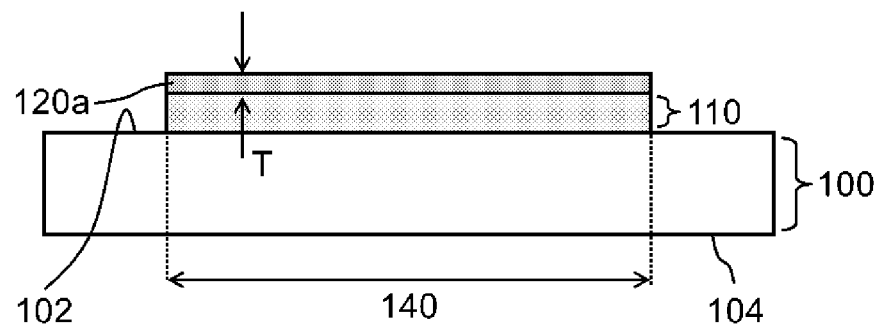
FIG. 3 is a view for describing an example of a method of manufacturing the light emitting device shown in FIG. 1.

FIG. 3 is a view for describing an example of a method of manufacturing the light emitting device 10 shown in FIG. 1.

The light emitting device 10 can be manufactured as follows.

First, the first electrode 110 is formed over the first surface 102 of the substrate 100. For example, the first electrode 110 may be formed by evaporating a metal or alloy (for example, silver or a silver alloy) using a mask or may be formed by patterning an oxide semiconductor.

Next, as shown in FIG. 3, the first layer 120a is formed over the first electrode 110. The first layer 120a can be formed by co-evaporating the first organic material and the metal compound. The volume percentage of the metal compound with respect to the total volume of the first layer 120a can be adjusted by controlling a condition for the co-evaporation. The first organic material and the metal compound may be co-evaporated without heating the substrate 100 or may be co-evaporated while the substrate 100 is heated at a specific temperature (for example, a temperature lower than the glass transition temperature Tg1 of the first organic material).

Next, the first layer 120a is heated at a temperature (heating temperature T1) equal to or higher than the glass transition temperature Tg1 of the first organic material. In the case of heating the first layer 120a at a temperature equal to or higher than the glass transition temperature Tg1 of the first organic material, the concentration of the metal compound can be lower at the position away from the first electrode 110 by a certain distance than at the position near the first electrode 110.

The reason for the generation of the above-described concentration distribution of the metal compound is assumed as follows. Before the heating of the first layer 120a, the metal compound is distributed almost uniformly regardless of the depth in the first layer 120a. When the first layer 120a is heated at a temperature equal to or higher than the glass transition temperature Tg1 of the first organic material, the first organic material exhibits fluidity. When the first organic material exhibits fluidity, some of the metal compound is precipitated toward the first electrode 110. The above-described concentration distribution of the metal compound is assumed to be generated as described above.

In addition, in the formation of the concentration distribution, the density of the metal compound is preferably higher than the density of the first organic material. Here, the density represents the mass per unit volume (g/cm$^3$).

The method of heating the first layer 120a is not limited to a specific method. For example, the first layer 120a can be heated by placing the substrate 100 under an environment of the heating temperature T1 of the first layer 120a (for example, the substrate 100 is placed on a hot plate or the substrate 100 is disposed in a vacuum heating oven) or by electromagnetic wave irradiation (for example, flash lamp annealing).

The heating temperature T1 may be, for example, a temperature of not less than 10° C. above the glass transition temperature Tg1 of the first organic material and a temperature of not more than 70° C. above the glass transition temperature Tg1 of the first organic material (Tg1+10≤T1≤Tg1+70) or a temperature of not less than 30° C. above the glass transition temperature Tg1 of the first organic material and a temperature of not more than 40° C. above the glass transition temperature Tg1 of the first organic material (Tg1+30≤T1≤Tg1+40).

The time for heating the first layer 120a at the heating temperature T1 may be, for example, equal to or longer than one minute and equal to or shorter than 60 minutes in the case of heating with a hot plate or an oven or equal to or longer than 1 µs and equal to or shorter than 1 s in the case of heating by flash lamp annealing.

Next, the HTL 120b (FIG. 1) is formed over the first layer 120a. In other words, the method according to this example includes a step of forming a second layer (the HTL 120b in the example shown in FIG. 1) in contact with the first layer 120a after heating the first layer 120a. In still other words, the first layer 120a is heated before the first layer 120a is covered with the second layer (the HTL 120b in the example shown in FIG. 1). The method of forming the HTL 120b is not limited to a specific method. For example, the HTL 120b can be formed by an evaporation or application process (for example, inkjet).

Next, the EML 120c, the ETL 120d, and the EIL 120e are formed. The method of forming the EML 120c, the ETL 120d, and the EIL 120e is not limited to a specific method. For example, the EML 120c, the ETL 120d, and the EIL 120e can be formed by an evaporation or application process (for example, inkjet).

Next, the second electrode 130 is formed. The method of forming the second electrode 130 is not limited to a specific method. For example, the second electrode 130 can be formed by evaporation.

The light emitting device 10 is manufactured as described above.

Figure 4:
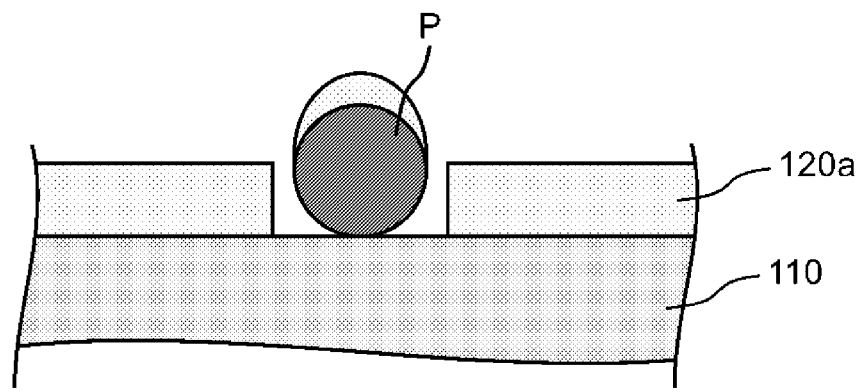
FIG. 4 is a view for describing an example of a reason for heating the first layer.
Figure 5:
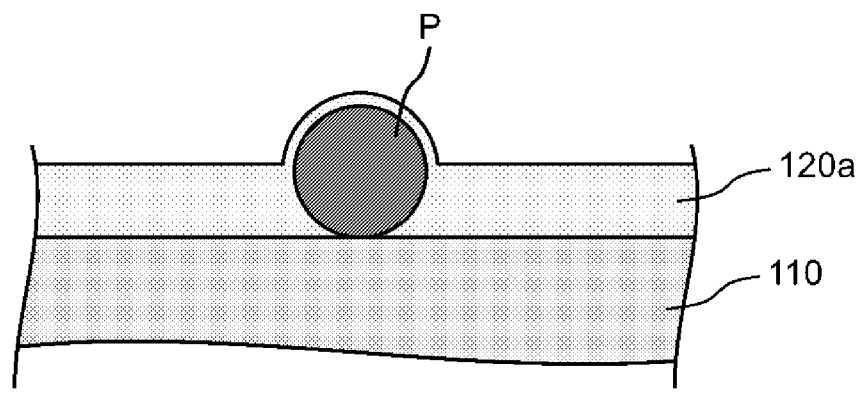
FIG. 5 is a view for describing the example of the reason for heating the first layer.

FIG. 4 and FIG. 5 are views for describing an example of the reason for heating the first layer 120a.

The reason for heating the first layer 120a may include not only the formation of the above-described concentration distribution of the metal compound but also the reason described using FIG. 4 and FIG. 5.

In the example shown in FIG. 4, a foreign matter P is attached to the surface of the first electrode 110. In the example shown in FIG. 4, since the substrate 100 (for example, FIG. 1 or FIG. 2) is moved from a chamber for forming the first electrode 110 to a chamber for forming the first layer 120a after the formation of the first electrode 110, the substrate 100 (for example, FIG. 1 or FIG. 2) is exposed to the atmosphere. During the movement of the substrate 100, a foreign matter in the atmosphere (the foreign matter P in the example shown in FIG. 4) may be attached to the surface of the first electrode 110.

In the example shown in FIG. 4, the first layer 120a is an evaporated layer and is formed by co-evaporating the first organic material and the metal compound. Layers formed by evaporation are inferior to layers formed by different deposition (for example, atomic layer deposition (ALD)) in terms of step coverage. Therefore, the first layer 120a may break around the foreign matter P. Formation of an element (for example, the second electrode 130 shown in FIG. 1) over the first layer 120a with the first layer 120a broken may cause a short circuit between the first electrode 110 and the second electrode 130 (for example, FIG. 1).

As shown in FIG. 5, the first layer 120a is heated in order to bury the foreign matter P with the first layer 120a. The first layer 120a is heated at a temperature that is equal to or higher than the glass transition temperature Tg1 of the first organic material and thereby exhibits fluidity. As shown in FIG. 4, the first layer 120a can be deformed by heating so as to bury the foreign matter P. The burying of the foreign matter P with the first layer 120a makes it possible to prevent a short circuit between the first electrode 110 and the second electrode 130 (for example, FIG. 1).

Modification Example

The light emitting device 10 according to a modification example is the same as the light emitting device 10 according to the embodiment except the following points.

The first electrode 110 functions as a cathode, and the first layer 120a functions as at least one of an electron injection layer and an electron transport layer. The first layer 120a contains a first organic material and a metal compound. The concentration of the metal compound in the first layer 120a can be made the same as the concentration in the embodiment by the method described in the embodiment.

The metal compound may be a metal compound having a donor property, such as lithium fluoride (LiF), lithium oxide ($Li_2O$), cesium fluoride (CsF), or calcium carbonate ($CaCO_3$).

Hitherto, the embodiment and the example have been described with reference to the drawings, but the embodiment and the example are examples of the present invention, and it is also possible to adopt a variety of configurations other than the above-described configurations.

This application claims priority based on Japanese Patent Application No. 2018-247736 filed Dec. 28, 2018, the disclosure of which is incorporated herein in its entirety.

REFERENCE SIGNS LIST

10: Light emitting device
100: Substrate
102: First surface
104: Second surface
110: First electrode
120: Organic layer
120a: First layer
120b: HTL
120c: EML
120d: ETL
120e: EIL
130: Second electrode
140: Light emitting portion
RG1: First region
RG2: Second region
RG3: Third region

The invention claimed is:

1. A light emitting device comprising:
a first electrode;
an organic layer positioned over the first electrode and comprising a first layer; and
a second electrode positioned over the organic layer,
wherein the first layer comprises
a first region comprising a first organic material and a compound comprising a metal element, the first region being in contact with the first electrode,
a second region comprising the first organic material and the compound, the second region being positioned farther away from the first electrode than the first region, and
a third region comprising the first organic material and the compound, the third region being positioned between the first region and the second region,
an average intensity of a SIMS profile of the metal element in the second region is lower than 10% of an average intensity of a SIMS profile of the metal element in the first region,
an intensity distribution of the SIMS profile of the metal element in the first region and an intensity distribution of the SIMS profile of the metal element in the second region are more uniform than an intensity distribution of a SIMS profile of the metal element in the third region, and
an intensity of the SIMS profile of the metal element in the third region decreases from the first region to the second region.

2. The light emitting device according to claim 1, wherein the first region has a thickness of equal to or larger than 10 nm.

3. The light emitting device according to claim 1, wherein a coefficient of variation of the SIMS profile of the metal element in the first region is larger than a coefficient of variation of the SIMS profile of the metal element in the second region.

4. The light emitting device according to claim 1, the average intensity of the SIMS profile of the metal element in the second region is lower than 1.0% of the average intensity of the SIMS profile of the metal element in the first region.

5. The light emitting device according to claim 1, wherein a density of the compound is higher than a density of the first organic material.

6. The light emitting device according to claim 1, wherein the compound is a metal oxide.

7. The light emitting device according to claim 1, wherein the compound is a molybdenum oxide.

8. The light emitting device according to claim 1, wherein a slope of the SIMS profile in the third region is equal to or more than 0.5%/nm and equal to or less than 20%/nm when the average intensity of the SIMS profile in the first region is 100%.

* * * * *